(12) United States Patent
Katayama

(10) Patent No.: US 6,899,560 B2
(45) Date of Patent: May 31, 2005

(54) JUMP WIRE STRUCTURE

(75) Inventor: Tatsuo Katayama, Fukui (JP)

(73) Assignee: Orion Electric Co., Ltd., Fukui (JP)

( * ) Notice: Subject to any disclaimer, the term of this patent is extended or adjusted under 35 U.S.C. 154(b) by 0 days.

(21) Appl. No.: 10/452,584

(22) Filed: Jun. 3, 2003

(65) Prior Publication Data
US 2004/0002257 A1 Jan. 1, 2004

(30) Foreign Application Priority Data
Jun. 26, 2002 (JP) ......................... 2002-186203

(51) Int. Cl.$^7$ .............................................. H01R 31/08
(52) U.S. Cl. ....................................................... 439/507
(58) Field of Search ......................................... 439/507

(56) References Cited

U.S. PATENT DOCUMENTS 2,389,255 A * 11/1945 Graham ...................... 439/425
4,335,272 A *  6/1982 Pittenger .................... 174/254
4,859,807 A *  8/1989 Swiggett et al. ............ 174/259
5,357,051 A * 10/1994 Hwang ........................ 174/33
5,493,076 A *  2/1996 Levite et al. ................ 174/261

FOREIGN PATENT DOCUMENTS

JP  405218607  *  8/1993
JP  06-334290      12/1994

* cited by examiner

Primary Examiner—Thanh-Tam Le
(74) Attorney, Agent, or Firm—Wenderoth, Lind & Ponack, L.L.P.

(57) ABSTRACT

Disclosed is an improved jump wire structure for a printed circuit board. The structure includes at least one jump wire having its opposite ends bent in same direction so as to face one another, and at least one slot provided in an upper surface of the printed circuit board. The slot has through holes provided at its opposite ends to permit insertion of the opposite ends of the jump wire. The jump wire can be put and fixed in the slot by inserting its opposite ends into the opposite through holes, bending the opposite ends and then soldering these bent ends to a printed circuit pattern formed on a lower or rear surface of the printed circuit board. This arrangement permits increase of a mounting density of parts and devices on the printed circuit board without fear of short-circuiting.

6 Claims, 5 Drawing Sheets

JUMP WIRE STRUCTURE

BACKGROUND OF THE INVENTION

1. Field of the Invention

The present invention relates to a jump wire structure having jump wires arranged on a printed circuit board.

2. Related Art

As is well known, a printed circuit board has electronic parts and/or devices such as CPU, ROM, condensers, resistors, diodes or transistors mounted on its upper or front side. The printed circuit board has a circuit pattern printed on its lower or rear side.

Such electronic parts and/or devices can be mounted on the printed circuit board by inserting their opposite terminal leads into through holes made in the printed circuit board, and by bending these leads on the lower or rear side of the board for soldering their terminal ends to the printed circuit pattern. Usually, many parts and devices are arranged in a limited space of the board. When the number of parts and devices increases beyond a permissible mounting density, it is necessary that printed circuit boards large enough to meet the permissible mounting density be used.

JP 6-334290(A) has proposed a three-dimensional wiring structure in which two jump wires cross each other, or a jump wire and a circuit component cross each other on a printed circuit board. This crossing arrangement significantly improves a mounting density with which circuit components are mounted on the printed circuit board. Jump wires make it possible to shorten a length of component-to-component connection. Advantageously, this shortening contributes to suppression of radiation of electromagnetic waves and appearance of noise signals in printed circuits.

Specifically, two jump wires cross each other on a front or upper side of a printed circuit board. Each jump wire has its opposite ends bent and passing through holes, which are provided in the printed circuit board. These holes extend from the front to a rear side of the board to correspond to terminal ends of selected conductors in an electric circuit, which is printed on a rear surface of the board. The opposite ends of each jump wire passing through the board and appearing on the rear side are soldered to the terminal ends of selected conductors in this printed circuit.

Assuming that such jump wires 6 are parallel-arranged as shown in FIG. 5(a), and that an external force is applied to any one or ones of these parallel jump wires 6 so as to be bent or inclined toward an adjacent jump wire, they often come to touch one another, thereby causing short circuits to appear in printed circuit 1.

Assuming that two parallel jump wires 6a and 6b lie across a circuit component as shown in FIG. 5(b), and that an external force is applied to these jump wires, they are often inclined toward each other so as to be in contact with one another. Then, short circuits will be caused in printed circuit 1.

In view of the above, one object of the present invention is to provide a jump wire structure for a printed circuit board, guaranteed to be free of causing short-circuits no matter whether jump wires are parallel-arranged or laid across each other on the printed circuit board.

SUMMARY OF THE INVENTION

A jump wire structure for a printed circuit board according to one aspect of the present invention comprises: at least one jump wire having its opposite ends bent in the same direction so as to face one another, and at least one slot provided in an upper or front surface of the printed circuit board, the slot having through holes provided at its opposite ends to permit insertion of the opposite ends of the jump wire, whereby the jump wire may be put and fixed in the slot by inserting its opposite ends into the opposite through holes, bending the opposite ends, and then soldering these bent ends to a printed circuit pattern formed on a lower or rear surface of the printed circuit board.

A jump wire structure for a printed circuit board according to another aspect of the present invention comprises: a plurality of jump wires each having its opposite ends bent in the same direction so as to face one another; and a plurality of slots provided parallel to one another at predetermined intervals in an upper or front surface of the printed circuit board, each slot having through holes provided at its opposite ends to permit insertion of the opposite ends of a selected jump wire, whereby selected jump wires may be put and fixed in the slots by inserting their opposite ends into the opposite through holes of the slots, bending the opposite ends, and then soldering these bent ends to a printed circuit pattern formed on a lower or rear side of the board while remaining jump wires are put on slot-to-slot spaces of the upper or front surface of the board.

A jump wire structure for a printed circuit board according to still another aspect of the present invention comprises: one or more jump wires each having its opposite ends bent in the same direction so as to face one another; and one or more slots provided in an upper or front surface of the printed circuit board, each slot having through holes provided at its opposite ends to permit insertion of the opposite ends of a selected jump wire, thus allowing the remaining jump wires, or electronic parts or devices to lie across the jump wire(s) in the slot(s).

Other objects and advantages of the present invention will be understood from jump wire structures according to some preferred embodiments of the present invention, which are shown in accompanying drawings.

BRIEF DESCRIPTION OF THE DRAWING

FIG. 1(a) is a plan view of slots provided in an upper or front surface of a printed circuit board, whereas

FIG. 2(a) is a plan view of slots each having a jump wire put therein, whereas

FIG. 3(a) is a plan view of two parallel slots each having a jump wire put therein and a single jump wire sandwiched therebetween, whereas

FIG. 4(a) is a perspective view of crossing jump wires, one being put in a slot, and the other lying across the one in the slot, whereas

DETAILED DESCRIPTION OF PREFERRED EMBODIMENTS

Figure 1A:
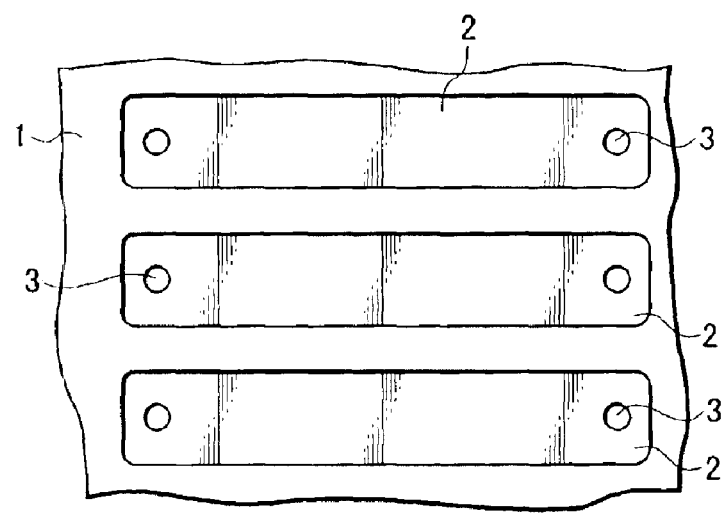
Figure 1B:
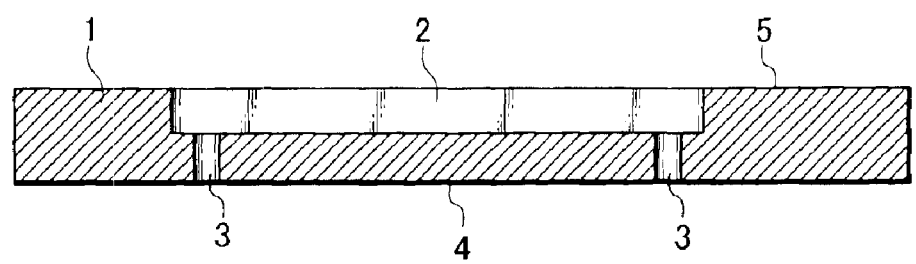
FIG. 1(b) is a sectional view of the printed circuit board taken along a longitudinal centerline of a selected slot in FIG. 1(a)

Referring to FIG. 1(a) and 1(b), a printed circuit board 1 has slots 2 provided in its front or upper surface 5. These slots 2 are made at predetermined positions by using, for example, an end mill whose cutting blade is as wide as the slot. The printed circuit board 1 has an electric circuit pattern printed on its rear or lower surface 4. Each slot 2 has through holes 3 provided at its opposite ends.

Figure 2A:
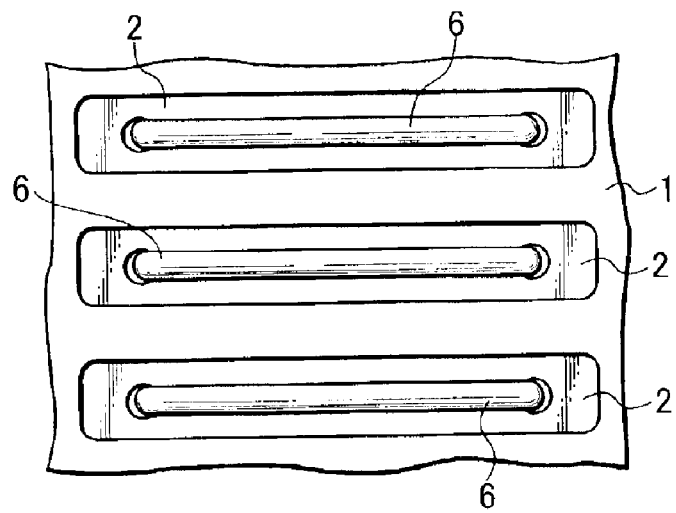
Figure 2B:
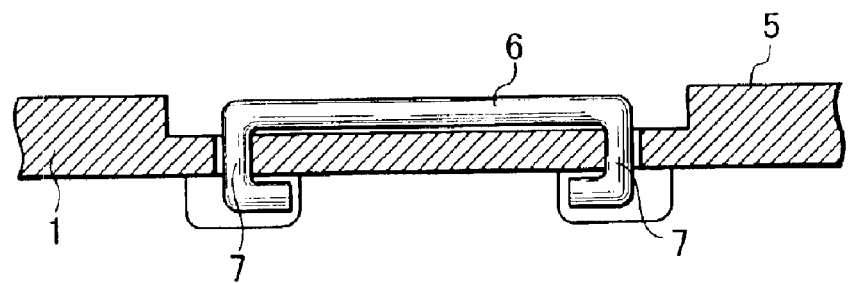
FIG. 2(b) is a sectional view of a printed circuit board taken along a line extending longitudinally along the jump wire in a selected slot of FIG. 2(a)

Referring to FIGS. 2(a) and 2(b), each slot 2 has one jump wire 6 fitted therein. Specifically each jump wire 6 has its opposite ends 7 bent in same direction so as to face one another. The jump wire 6 is fixed in the slot 2 by inserting its opposite ends 7 into opposite through holes 3 and then bending the ends 7. Lengths of the bent ends appearing from a rear or lower surface of the printed circuit board 1 are soldered to the printed circuit pattern.

Any of the slotted jump wires 6 cannot be deformed or bent even though an exterior force is applied, and therefore, adjacent jump wires 6 cannot be put into contact with each other. Thus, there is no fear of causing short-circuits.

Usually, the jump wire 6 is completely buried in the slot 2 as shown in FIG. 2(b). However, even if slots 2 are not deep enough, thereby allowing the jump wires 6 to partly appear from these shallow slots, the jump wires 6 are still prevented from being deformed so as to touch an adjacent jump wire 6.

Figure 3A:
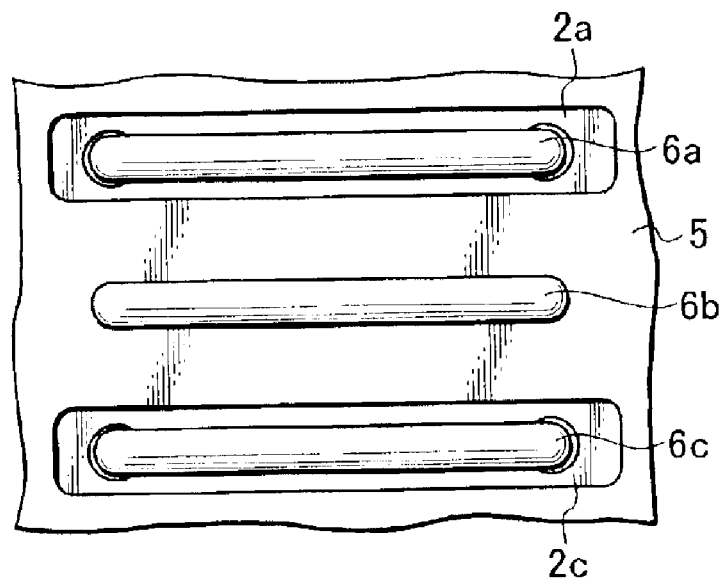
Figure 3B:
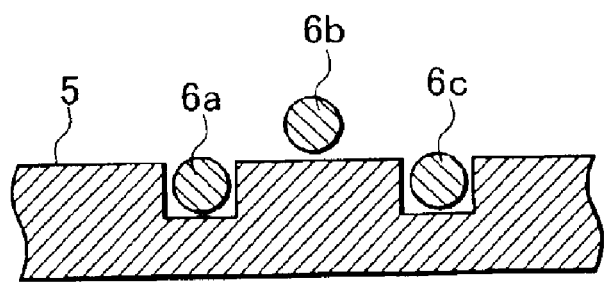
FIG. 3(b) is a sectional view of a printed circuit board taken along a line laterally crossing the slots of FIG. 3(a)

Referring to FIGS. 3(a) and 3(b), a central jump wire 6b is laid on the front or upper surface 5 of the printed circuit board, and two jump wires 6a and 6c are put in slots 2a and 2c, which are provided on opposite sides of the central jump wire 6b. The central jump wire 6b cannot touch either jump wire 6a or 6c, provided that these jump wires are separated a sufficient distance, or that these jump wires 6a and 6c are hidden completely in the slots 2a and 2c.

Figure 4A:
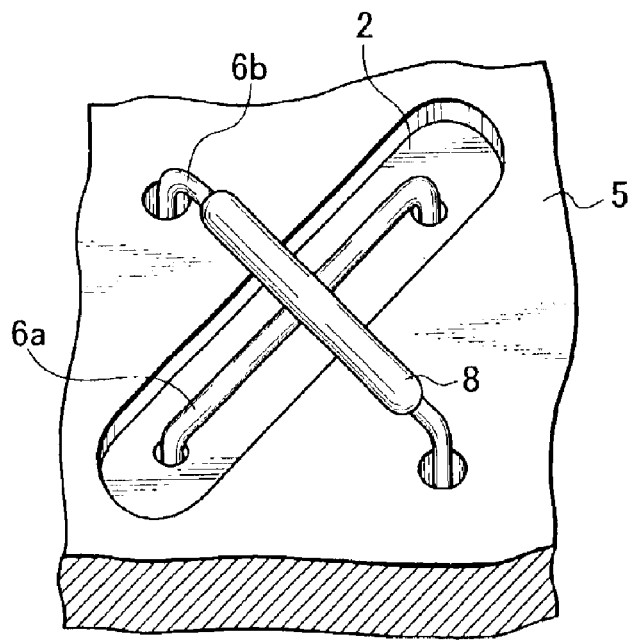
Figure 4B:
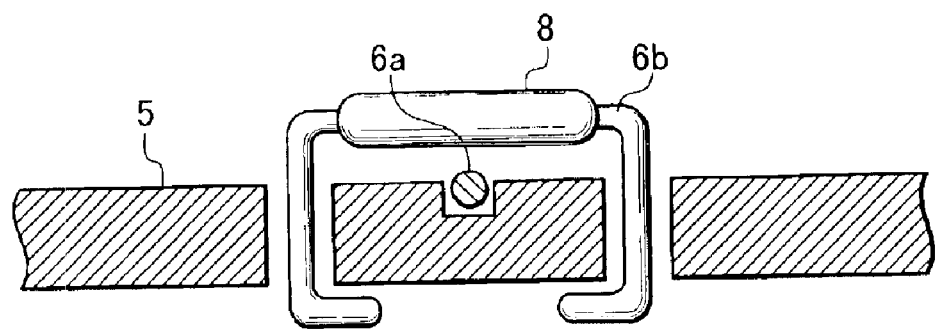
FIG. 4(b) is a sectional view taken along a line parallel to the jump wire lying across the one in the slot.
Figure 5A:
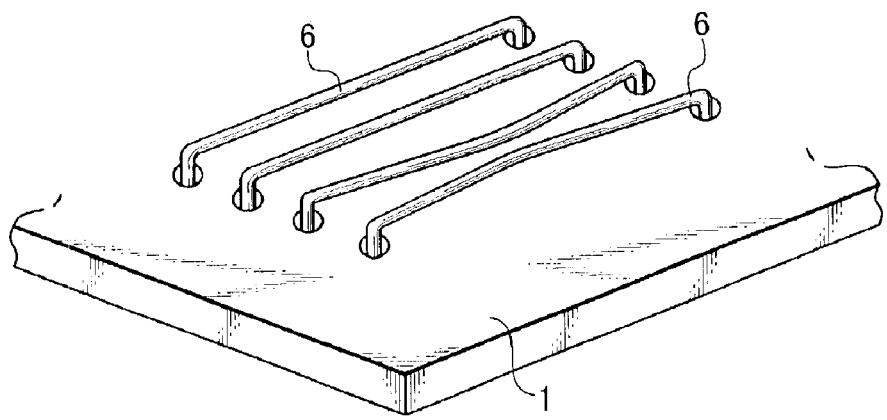
FIGS. 5(a) and 5(b) show conventional jump wires arranged on a printed circuit board.
Figure 5B:
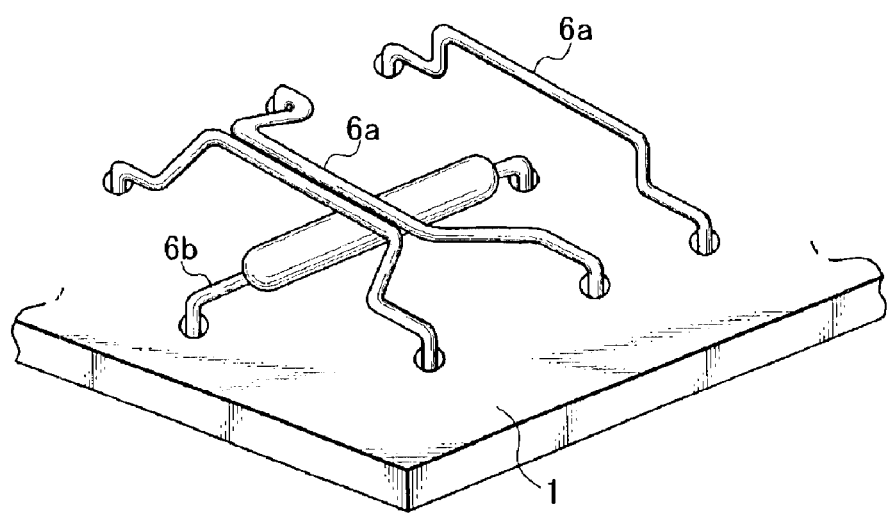

Referring to FIGS. 4(a) and 4(b), two jump wires 6a and 6b lie across each other. One of these jump wires is put in a slot 2 whereas the other jump wire is laid on upper or front surface 5 of printed circuit board 1. Thus, these jump wires are prevented from touching one another, thereby guaranteed to be free of short-circuiting. Usually the jump wire 6a cannot be raised to partly appear from the slot 2. However, with a view to make the jump wires safe against unusual rise of slotted jump wire 6a, overlying jump wire 6b is covered with an insulating material 8.

An electronic part or device other than the jump wire 6b may be arranged to lie across the slotted jump wire 6a.

As is clear from the figures, each slot is a straight-line slot; i.e. a slot having no bends therein.

As may be understood from the above, a jump wire structure according to the present invention provides the following advantages:

a plurality of slotted jump wires cannot be moved toward each other to be short-circuited, and therefore, a mounting density of jump wires can be increased by decreasing a slot-to-slot space in a printed circuit board. This close arrangement of jump wires thus attained contributes to a significant reduction of board size. Also, slotted jump wires contribute to significant reduction of component-to-component connections in a printed circuit, thereby effectively suppressing radiation of electromagnetic waves and appearance of noise signals.

Jump wires of the same shape can be used for putting into slots or crossing over slots, thereby not necessitating use of overlying jump wires whose shape is different from a slotted jump wire. A compatible use of slotted and overlying jump wires facilitates use of jump wires in wiring, thereby improving wiring efficiency. Electronic parts or devices can be mounted to lie across slotted jump wires.

What is claimed is:

1. A jump wire structure comprising:

a first straight-line slot in a front surface of a circuit board, the circuit board having a circuit pattern on a rear surface thereof;

first through holes extending through a surface that defines said first straight-line slot, said first through holes being at opposite ends of said first straight-line slot, respectively, and extending perpendicularly to the front and rear surfaces of the circuit board;

a first jump wire in said first straight-line slot, with each end of said first jump wire extending through a respective one of said first through holes and being bent in the same direction so as to face one another such that said each end of said first jump wire can be electrically connected to the printed circuit pattern by being soldered to the printed circuit pattern;

a second straight-line slot in the front surface of the circuit board;

second through holes extending through a surface that defines said second straight-line slot, said second through holes being at opposite ends of said second straight-line slot, respectively, and extending perpendicularly to the front and rear surfaces of the circuit board;

a second jump wire in said second straight-line slot, with each end of said second jump wire extending through a respective one of said second through holes and being bent in the same direction so as to face one another such that said each end of said second jump wire can be electrically connected to the printed circuit pattern by being soldered to the printed circuit pattern; and a third jump wire on the front surface of the circuit board, wherein said first straight-line slot and said second straight-line slot are parallel and spaced by a predetermined interval, and said third jump wire extends parallel to said first straight-line slot and said second straight-line slot.

2. The jump wire structure according to claim 1, wherein said third jump wire extends between said first straight-line slot and said second straight-line slot.

3. The jump wire structure according to claim 2, wherein said first through holes extend from a surface that defines a bottom of said first straight-line slot, and said second through holes extend from a surface that defines a bottom of said second straight-line slot.

4. A jump wire structure comprising:

a first straight-line slot in a front surface of a circuit board, the circuit board having a circuit pattern on a rear surface thereof;

first through holes extending through a surface that defines said first straight-line slot, said first through holes being at opposite ends of said first straight-line slot, respectively, and extending perpendicularly to the front and rear surfaces of the circuit board;

a first jump wire in said first straight-line slot, with each end of said first jump wire extending through a respective one of said first through holes and being bent in the same direction so as to face one another such that said each end of said first jump wire can be electrically connected to the printed circuit pattern by being soldered to the printed circuit pattern;

a second straight-line slot in the front surface of the circuit board;

second through holes extending through a surface that defines said second straight-line slot, said second through holes being at opposite ends of said second straight-line slot, respectively, and extending perpendicularly to the front and rear surfaces of the circuit board;

a second jump wire in said second straight-line slot, with each end of said second jump wire extending through a respective one of said second through holes and being bent in the same direction so as to face one another such that said each end of said second jump wire can be electrically connected to the printed circuit pattern by being soldered to the printed circuit pattern; and a third jump wire on the front surface of the circuit board, wherein said first straight-line slot and said second straight-line slot are parallel and spaced by a predetermined interval, and said third jump wire extends across one of said first straight-line slot and said second straight-line slot.

5. The jump wire structure according to claim 4, wherein said first through holes extend from a surface that defines a bottom of said first straight-line slot, and said second through holes extend from a surface that defines a bottom of said second straight-line slot.

6. The jump wire structure according to claim 1, wherein said first through holes extend from a surface that defines a bottom of said first straight-line slot, and said second through holes extend from a surface that defines a bottom of said second straight-line slot.

* * * * *